(12) United States Patent
Schulze et al.

(10) Patent No.: US 9,887,125 B2
(45) Date of Patent: Feb. 6, 2018

(54) METHOD OF MANUFACTURING A SEMICONDUCTOR DEVICE COMPRISING FIELD STOP ZONE

(71) Applicant: Infineon Technologies AG, Neubiberg (DE)

(72) Inventors: Holger Schulze, Villach (AT);
Hans-Joachim Schulze, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/297,764

(22) Filed: Jun. 6, 2014

(65) Prior Publication Data

US 2015/0357229 A1   Dec. 10, 2015

(51) Int. Cl.
*H01L 21/265* (2006.01)
*H01L 21/268* (2006.01)
*H01L 21/765* (2006.01)
*H01L 21/324* (2006.01)
*H01L 29/32* (2006.01)
*H01L 29/66* (2006.01)
*H01L 29/861* (2006.01)
(Continued)

(52) U.S. Cl.
CPC .......... *H01L 21/765* (2013.01); *H01L 21/268* (2013.01); *H01L 21/26506* (2013.01); *H01L 21/26513* (2013.01); *H01L 21/324* (2013.01); *H01L 29/32* (2013.01); *H01L 29/6634* (2013.01); *H01L 29/66136* (2013.01); *H01L 29/7396* (2013.01); *H01L 29/861* (2013.01);
*H01L 29/16* (2013.01); *H01L 29/1608* (2013.01); *H01L 29/2003* (2013.01)

(58) Field of Classification Search
None
See application file for complete search history.

(56) References Cited

U.S. PATENT DOCUMENTS 4,782,029 A  * 11/1988  Takemura et al. ............ 438/472
8,367,532 B2    2/2013  Mauder et al.
(Continued)

FOREIGN PATENT DOCUMENTS

CN    101494223 A    7/2009
CN    102034684 A    4/2011

OTHER PUBLICATIONS

Job, et al., "Distribution of Hydrogen-and Vacancy-Related Donor and Acceptor States in Helium-Implanted and Plasma-Hydrogenated Float-Zone Silicon", Master Research Society Symposium Proceedings, 2010, pp. 1-6, vol. 1195, Materials Research Society.

*Primary Examiner* — Jay C Kim
*Assistant Examiner* — Bo Bin Jang
(74) *Attorney, Agent, or Firm* — Murphy, Bilak & Homiller, PLLC

(57) ABSTRACT

A method of manufacturing a semiconductor device includes forming a field stop zone by irradiating a portion of a semiconductor body with a laser beam through a first surface of the semiconductor body. The portion has an oxygen concentration in a range of $5 \times 10^{16}$ cm$^{-3}$ and $5 \times 10^{17}$ cm$^{-3}$. Then the semiconductor body is irradiated with protons through the first surface and annealed in a temperature range of 300° C. to 550° C.

21 Claims, 7 Drawing Sheets

(51) Int. Cl.
*H01L 29/739* (2006.01)
*H01L 29/16* (2006.01)
*H01L 29/20* (2006.01)

(56) References Cited

U.S. PATENT DOCUMENTS

| | | | |
|---|---|---|---|
| 2009/0087631 A1* | 4/2009 | Schulze et al. | 428/213 |
| 2009/0283866 A1* | 11/2009 | Schulze et al. | 257/607 |
| 2009/0286373 A1* | 11/2009 | Tan | H01L 21/26506 438/301 |
| 2013/0249058 A1* | 9/2013 | Neidhart et al. | 257/607 |

* cited by examiner

METHOD OF MANUFACTURING A SEMICONDUCTOR DEVICE COMPRISING FIELD STOP ZONE

BACKGROUND

In semiconductor devices such as semiconductor diodes, insulated gate bipolar transistors (IGBTs) or insulated gate field effect transistors (IGFETs) a low doping concentration of a base material such as a wafer before front end of line (FEOL) processing serves for realizing a DC voltage blocking requirement of the semiconductor device. A low doping concentration of the base material has the effect that the space charge zone propagates very far, which has to be compensated for by means of an increase in chip thickness of the semiconductor device if the intention is to ensure that the space charge zone does not reach a rear-side contact region.

In order to keep down the chip thicknesses, it has been proposed to introduce a field stop zone, that is to say a zone of increased doping with respect to the doping of the base material, in the semiconductor volume of the semiconductor device, which zone may be configured in stepped fashion, for example. The field stop zone allows for absorption of voltage or decrease of the electric field strength over a lateral distance that is smaller compared to the base material.

When manufacturing a field stop zone, a trade-off between a variety of characteristics such as low device leakage currents, cost-effectiveness and process compatibility with respect to temperature budget requirements.

It is desirable to provide an improved method of manufacturing a semiconductor device comprising a field stop zone.

SUMMARY

According to an embodiment, a method of manufacturing a semiconductor device comprises forming a field stop zone by irradiating a portion of a semiconductor body with a laser beam through a first surface of the semiconductor body. The portion comprises an oxygen concentration in a range of $5 \times 10^{16}$ cm$^{-3}$ to $5 \times 10^{17}$ cm$^{-3}$. The method further comprises irradiating the semiconductor body with protons through the first surface and annealing the semiconductor body in a temperature range of 300° C. to 550° C.

According to another embodiment, a method of manufacturing semiconductor diode comprises forming an anode region in a semiconductor body having opposite first and second sides by introducing p-type dopants through the second side into the semiconductor body. The method further comprises forming a cathode region in the semiconductor body by introducing n-type dopants through the first side into the semiconductor body. The method further comprises forming a field stop zone by irradiating a portion of the semiconductor body with a laser beam through a first surface of the semiconductor body. The portion comprises an oxygen concentration in a range of $5 \times 10^{16}$ cm$^{-3}$ and $5 \times 10^{17}$ cm$^{-3}$. The method further comprises irradiating the semiconductor body with protons through the first surface and annealing the semiconductor body in a temperature range of 300° C. to 550° C.

According to another embodiment, a method of manufacturing a semiconductor device comprises introducing platinum into a semiconductor body comprising an oxygen concentration in a range of $5 \times 10^{16}$ cm$^{-3}$ to $5 \times 10^{17}$ cm$^{-3}$. The method further comprises irradiating the semiconductor body with protons through a first surface, the. The method further comprises annealing the semiconductor body in a temperature range of 300° C. to 550° C.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
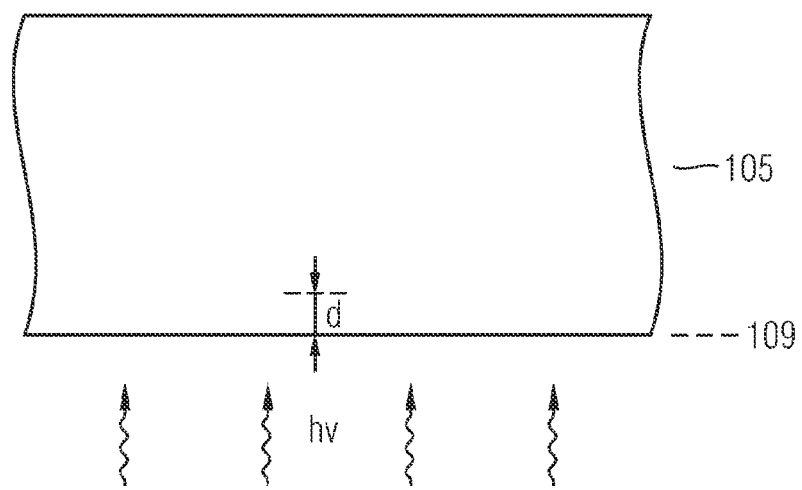
FIG. 1A is a schematic cross-sectional view of a portion of a semiconductor body for illustrating a process of irradiating a portion of the semiconductor body with a laser beam through a first surface being part of a method of manufacturing a field stop zone of a semiconductor device.
Figure 1B:
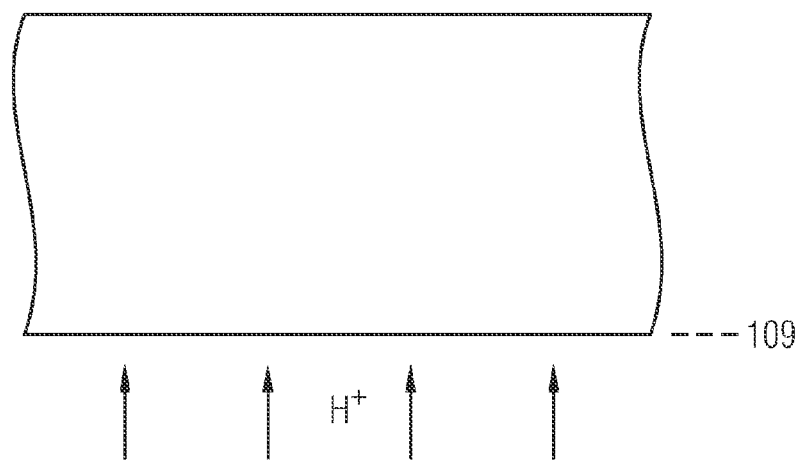
FIG. 1B is a schematic cross-sectional view of the semiconductor body of FIG. 1A for illustrating a process of irradiating the semiconductor body with protons through the first surface.
Figure 1C:
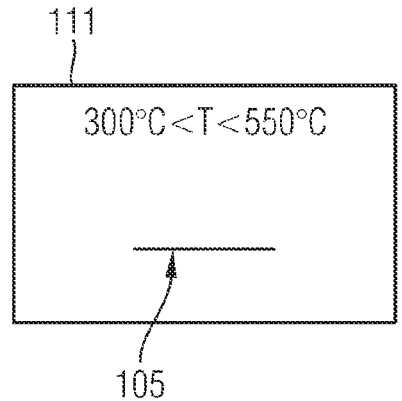
FIG. 1C is a schematic cross-sectional view of the semiconductor body of FIG. 1B for illustrating a process of annealing the semiconductor body in a temperature range of 300° C. to 550° C.

FIGS. 1A to 1C are schematic cross-sectional views of a portion of a semiconductor body 105 for illustrating a process of manufacturing a semiconductor device comprising a field stop zone.

FIG. 1A is a schematic cross-sectional view of the semiconductor body 105 for illustrating a process of irradiating a portion of the semiconductor body 105 with a laser beam 107 through a first surface 109. The portion comprises an oxygen concentration in a range of $5 \times 10^{16}$ cm$^{-3}$ and $5 \times 10^{17}$ cm$^{-3}$, or even of $1 \times 10^{17}$ cm$^{-3}$ and $3 \times 10^{17}$ cm$^{-3}$. The semiconductor body 105 may be a semiconductor wafer, for example a silicon wafer. According to an embodiment the semiconductor body 105 is a silicon wafer obtained by a Czochralski growth process, for example a magnetic Czochralski (MCZ) silicon wafer. According to other embodiments, a substrate of another single-crystalline semiconductor material such as silicon carbide SiC, gallium arsenide GaAs, gallium nitride GaN or another $A_{III}B_V$ semiconductor, germanium Ge or a silicon germanium crystal SiGe.

Irradiating the portion of the semiconductor body 105 with the laser beam 107 allows for generation of vacancies in the portion heated by absorption of the laser beam. According to an embodiment, the absorption of the laser beam locally melts the semiconductor body followed by a recrystallization. Vacancies may be generated due to thermal stress caused by the absorption of the laser beam.

According to an embodiment, irradiating the portion of the semiconductor body 105 with the laser beam 107 leads to an increase of a density of vacancies in a part of the semiconductor body 105 between the first surface 109 and a depth d, wherein d typically ranges between 5 and 30 µm, or between 15 and 25 µm. The depth d may also be increased by multiple irradiations with the laser beam 107, e.g. by multiple laser pulses.

FIG. 1B is a schematic cross-sectional view of the semiconductor body of FIG. 1A for illustrating a process of irradiating the semiconductor body with protons through the first surface 109.

According to an embodiment, the proton irradiation is carried out at energies ranging from one or several hundreds of keV to 5 MeV, or from 200 keV to 4 MeV, or from 300 keV to 1.5 MeV. According to another embodiment, a plurality of proton irradiations, for example two, three, four or five proton irradiations are carried out at different energies, e.g. from below 500 keV to more than 1 MeV. Multiple proton irradiations at different energies allow for manufacturing a field stop zone including a plurality of doping peaks, for example.

According to an embodiment, the proton irradiation is carried out at a dose ranging from $0.5 \times 10^{13}$ protons/cm$^2$ to $5 \times 10^{14}$ protons/cm$^2$. According to another embodiment, a plurality of proton irradiations, for example two, three, four or five proton irradiations are carried out at different doses. A sum of all irradiation doses of the plurality of proton irradiations may range from several $10^{13}$ protons/cm$^2$ to tens of $10^{14}$ protons/cm$^2$, e.g. from $2 \times 10^{13}$ protons/cm$^2$ to $8 \times 10^{14}$ protons/cm$^2$. Also a combination of different irradiation doses and energies may be used to achieve a desired profile of a field stop zone.

FIG. 1C is a schematic cross-sectional view of the semiconductor body of FIG. 1B for illustrating a process of annealing the semiconductor body in a temperature range of 300° C. to 550° C., or between 350° C. to 430, or between 380° C. to 420° C. The process of annealing may be carried out in a thermal processing system 111, for example in a furnace and/or a rapid thermal processing (RTP) system. The semiconductor body 105 may be supported by a holding fixture in the thermal processing system 111, for example.

According to an embodiment, the annealing is carried for a duration between 30 minutes to four hours.

Proton irradiation and annealing lead to doping by hydrogen-supported thermal donor formation such as hydrogen-related shallow donor complexes, e.g. hydrogen-vacancy donor complexes.

The combination of an increased density of vacancies and an oxygen concentration in a range of $5 \times 10^{16}$ cm$^{-3}$ and $5 \times 10^{17}$ cm$^{-3}$ allows for an increased level of dopant activation of proton irradiation induced doping.

According to an embodiment, platinum is introduced into the semiconductor body 105, e.g. by a diffusion process or a platinum implantation with a subsequent drive-in step. Platinum in the semiconductor body 105 may serve for adjustment of minority carrier lifetime, e.g. in power semiconductor diodes. The process described with respect to FIGS. 1A to 1C leads to an increased absorption of the implanted hydrogen due to formation of hydrogen-related shallow donor complexes. This counteracts undesired formation of platinum-hydrogen complexes and thus leads to a reduction of leakage currents. Furthermore, a risk of pn junction formation between field stop peaks caused by acceptor-like hydrogen-vacancy-platinum complexes may be reduced.

Proton irradiation and laser irradiation may be carried in any sequence and also multiple times, for example in the sequence laser irradiation, proton irradiation or in the sequence proton irradiation, laser irradiation and any combination thereof. The number of proton and laser irradiations may be equal or differ from each other.

Figure 2:
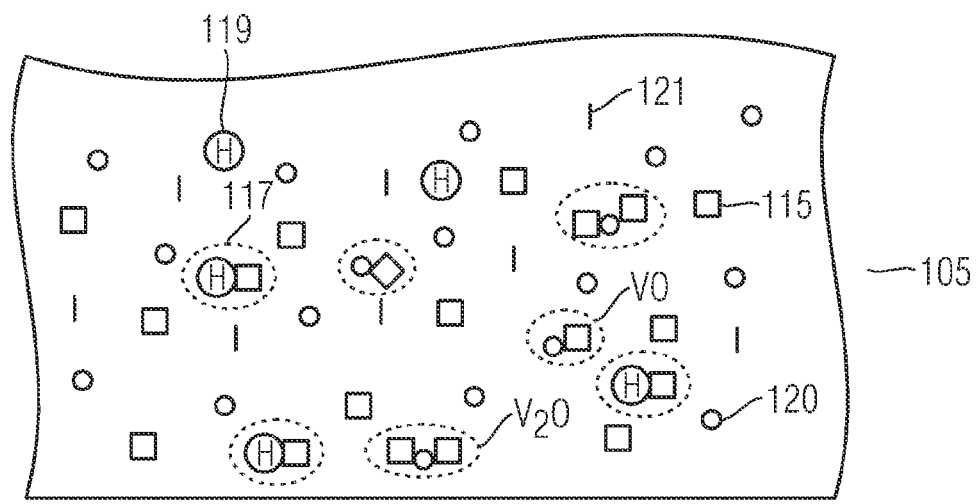
FIG. 2 is a schematic cross-sectional view of the body of FIG. 1C for illustrating an interaction between different crystal defects and/or impurities.

FIG. 2 is a schematic cross-sectional view of the semiconductor body 105 of FIG. 1C for illustrating an interaction between different crystal defects and/or impurities.

The irradiation of the semiconductor body 105 with the laser beam 107 leads to an increased generation of vacancies 115. In case of a vacancy-limited level of dopant activation of proton irradiation induced doping, an increase of activated hydrogen-vacancy shallow donor complexes 117 may be achieved by irradiating the semiconductor body 105 with a laser beam resulting in additional vacancies available for the donor formation. Furthermore, the combination of oxygen 120 typically present in MCZ base material and a decreased level of interstitial silicon atoms 121 hinder leakage of vacancies 115 by diffusion due to formation of vacancy-oxygen (VO) complexes or divacancy-oxygen ($V_2O$) complexes. Thereby, an effective diffusion constant of vacancies during an annealing process at temperatures in a range of 300° C. to 550° C., or between 350° C. to 430° C., or between 380° C. to 420° C. for durations in a range of tens of minutes to several hours is substantially reduced, leading to an increased formation of the hydrogen-vacancy shallow donor complexes 117. Due to the increased formation of the hydrogen-vacancy shallow donor complexes 117 less hydrogen 119 is available for undesired thermal donor formation such as oxygen donors, and for the formation of platinum hydrogen complexes which can result in a significantly increased leakage current. Thereby, negative impact of thermal donors on device characteristics such as variation of overall doping, leakage currents and breakdown voltage may be reduced or suppressed.

The increased activation of hydrogen-vacancy shallow donor complexes 117 allows for a reduction of the required implantation dose and, consequently, for a reduction of costs.

Figure 3A:
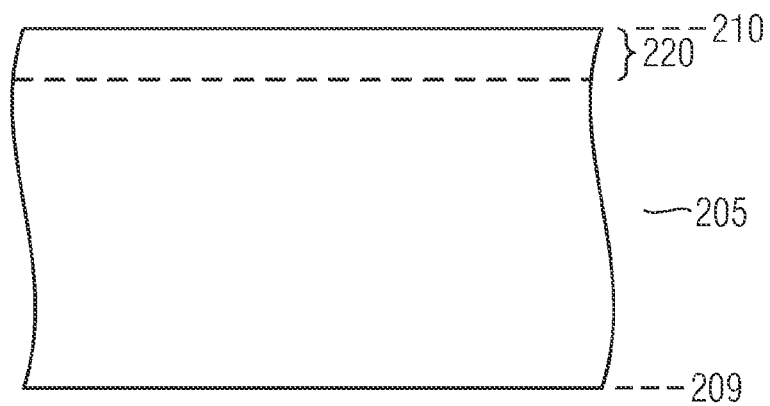
FIG. 3A is a schematic cross-sectional view of a portion of a semiconductor body for illustrating a process of forming a first load terminal structure of a vertical power semiconductor device a second side of the semiconductor body having opposite first and second sides.

FIG. 3A is a schematic cross-sectional view of a portion of a semiconductor body 205 for illustrating a process of forming a first load terminal structure 220 of a vertical power semiconductor device at a second side 210, e.g. front side of the semiconductor body 205 having opposite first and second sides 209, 210.

The process may comprise doping processes of the semiconductor body 205 at the second side 210, e.g. diffusion and/or ion implantation processes for forming doped semiconductor region(s) in the semiconductor body 205 at the second side 210. The doped semiconductor region(s) in the semiconductor body 205 of the first load terminal structure 220 may include doped source and body regions of a vertical power FET or of an emitter of an IGBT, or an anode or cathode region of a vertical power semiconductor diode.

Figure 3B:
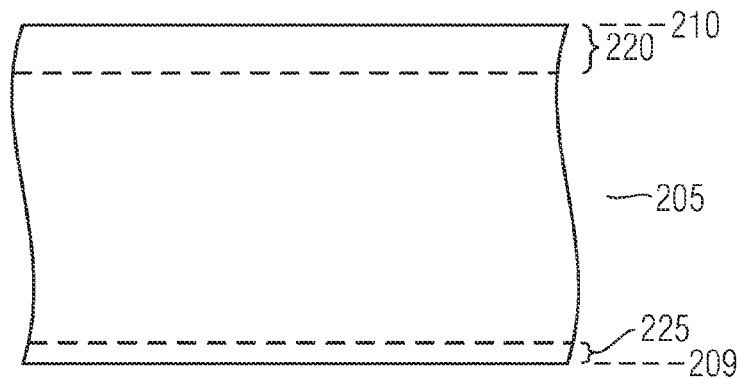
FIG. 3B is a schematic cross-sectional view of the semiconductor body of FIG. 3A for illustrating a process of forming a second load terminal structure at the first side of the semiconductor body.

FIG. 3B is a schematic cross-sectional view of the semiconductor body of FIG. 3A for illustrating a process of forming a second load terminal structure 225 at the first side 209, e.g. rear side of the semiconductor body 205.

The process may comprise doping processes of the semiconductor body 205 at the first side 209, e.g. diffusion and/or ion implantation processes for forming doped semiconductor region(s) in the semiconductor body 205 at the first side 209. The doped semiconductor region(s) in the semiconductor body 205 of the second load terminal structure 225 may include doped drain regions of a vertical power FET, or an emitter of an IGBT, or an anode or cathode region of a vertical power semiconductor diode, for example.

Figure 3C:
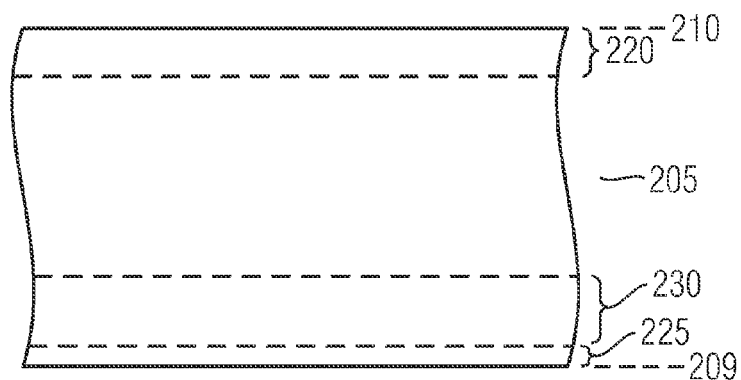
FIG. 3C is a schematic cross-sectional view of the semiconductor body of FIG. 3B for illustrating a process of forming a field stop zone at the second side of the semiconductor body.

FIG. 3C is a schematic cross-sectional view of the semiconductor body 205 of FIG. 3B for illustrating a process of forming a field stop zone 230 at the first side 209 of the semiconductor body 205.

The process of forming the field stop zone 230 comprises the process features illustrated in FIGS. 1A to 1C and described above. The process of irradiating the portion of the semiconductor body 105 with the laser beam 107 as illustrated in FIG. 1A may activate dopants introduced beforehand by ion implantation in FIG. 3B, for example. Thus, laser irradiation may have a double function by causing generation of vacancies and activating dopants introduced beforehand by ion implantation, for example.

In the course of processing the semiconductor body 205 at the second side 210, depending on the power semiconductor device to be formed in the semiconductor body, a control terminal structure such as a planar gate structure and/or a trench gate structure including gate dielectric(s) and gate electrode(s) may be formed.

Figure 3D:
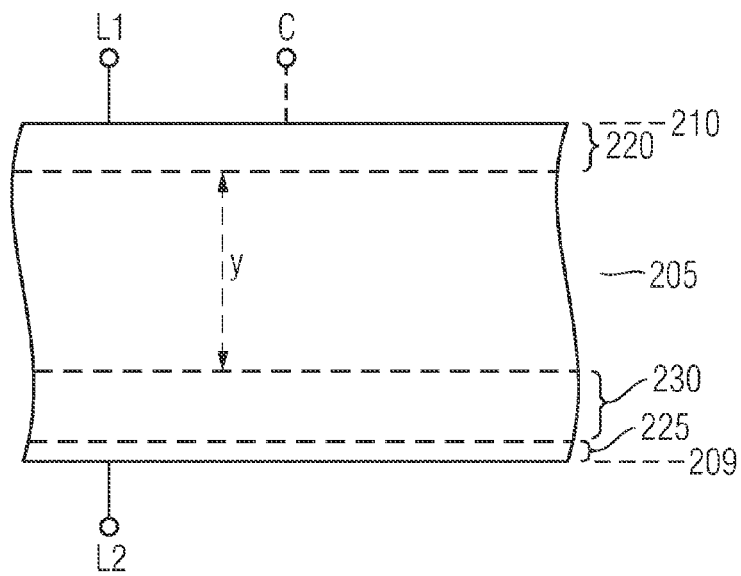
FIG. 3D is a schematic cross-sectional view of the semiconductor body of FIG. 3B for illustrating a process of forming contacts at the first and second sides of the semiconductor body.

FIG. 3D is a schematic cross-sectional view of the semiconductor body 205 of FIG. 3B for illustrating a process of forming contacts at the first and second sides 209, 210 of the semiconductor body 205.

The process of forming contacts at the first and second sides 209, 210 may comprise forming one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers. The patterned conductive layer(s) and interlevel dielectric layer(s) may form a wiring area above the semiconductor body 205 at the second side 210, for example. A conductive layer, e.g. a metallization layer or metallization layer stack may be provided at the first side 209, for example.

A first electrical load contact L1 to the first load terminal structure 220 and an electrical control terminal contact C to a control terminal structure, if present in the vertical power semiconductor device, may thus be formed in the wiring area above the second side 210. A second electrical load contact L2 to the second load terminal structure 225 may be provided at the first side 209.

The power semiconductor device manufactured in the semiconductor body 205 including the process features illustrated in FIGS. 3A to 3D is a vertical power semiconductor device having a current flow between first and second load terminal contacts L1, L2 between opposite first and second sides 209, 210.

Figure 4:
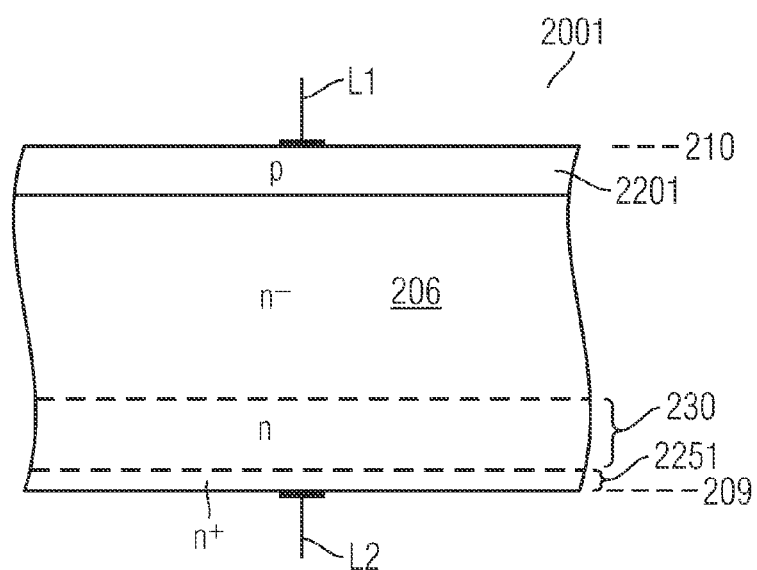
FIG. 4 is a schematic cross-sectional view of a semiconductor body of a power semiconductor diode comprising a field stop zone.

FIG. 4 is a schematic cross-sectional view of the semiconductor body 205 illustrated in FIG. 3D after forming a power semiconductor diode 2001 comprising the field stop zone 230 by the processes illustrated in FIGS. 1A to 1C and FIGS. 3A to 3D. The power semiconductor diode 2001 includes an n⁻-doped drift zone 206. The n⁻-doped drift zone 206 may be part of an n⁻-doped base material, e.g. an n⁻-doped wafer. A p-doped anode region 2201 at the second side 210 is in electrical contact with the first load terminal contact L1. An n⁺-doped cathode region 2251 at the second side 210 is in electrical contact with the second load terminal contact L2.

Figure 5:
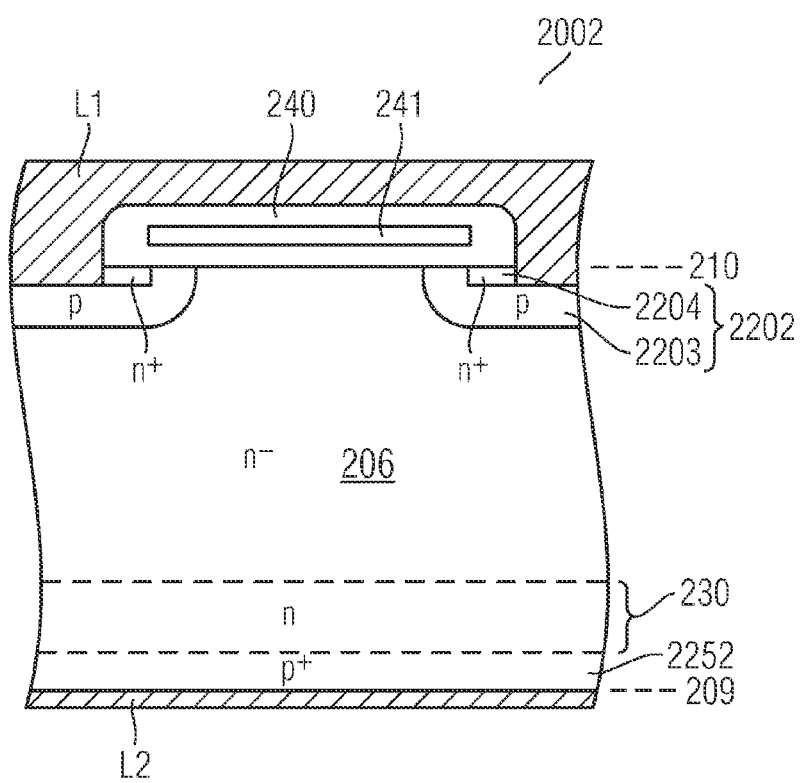
FIG. 5 is a schematic cross-sectional view of a semiconductor body of a power insulated gate bipolar transistor comprising a field stop zone.

FIG. 5 is a schematic cross-sectional view of the semiconductor body 205 after forming a power IGBT 2002 comprising the field stop zone 230 by the processes illustrated in FIGS. 1A to 1C and FIGS. 3A to 3D. The power IGBT 2002 includes an n⁻-doped drift zone 206. The n⁻-doped drift zone 206 may be part of an n⁻-doped base material, e.g. an n⁻-doped wafer. An emitter structure 2202 at the second side 210 includes p-doped body region 2203 and an n⁺-doped source region 2204. The emitter structure is in electrical contact with the first load terminal contact L1. A gate structure including a dielectric 240 and a gate electrode 241 is formed on the semiconductor body 205 at the second side 210. An IGBT collector including a p⁺-doped rear side emitter 2252 at the first side 209 is in electrical contact to the second load terminal contact L2.

Figure 6:
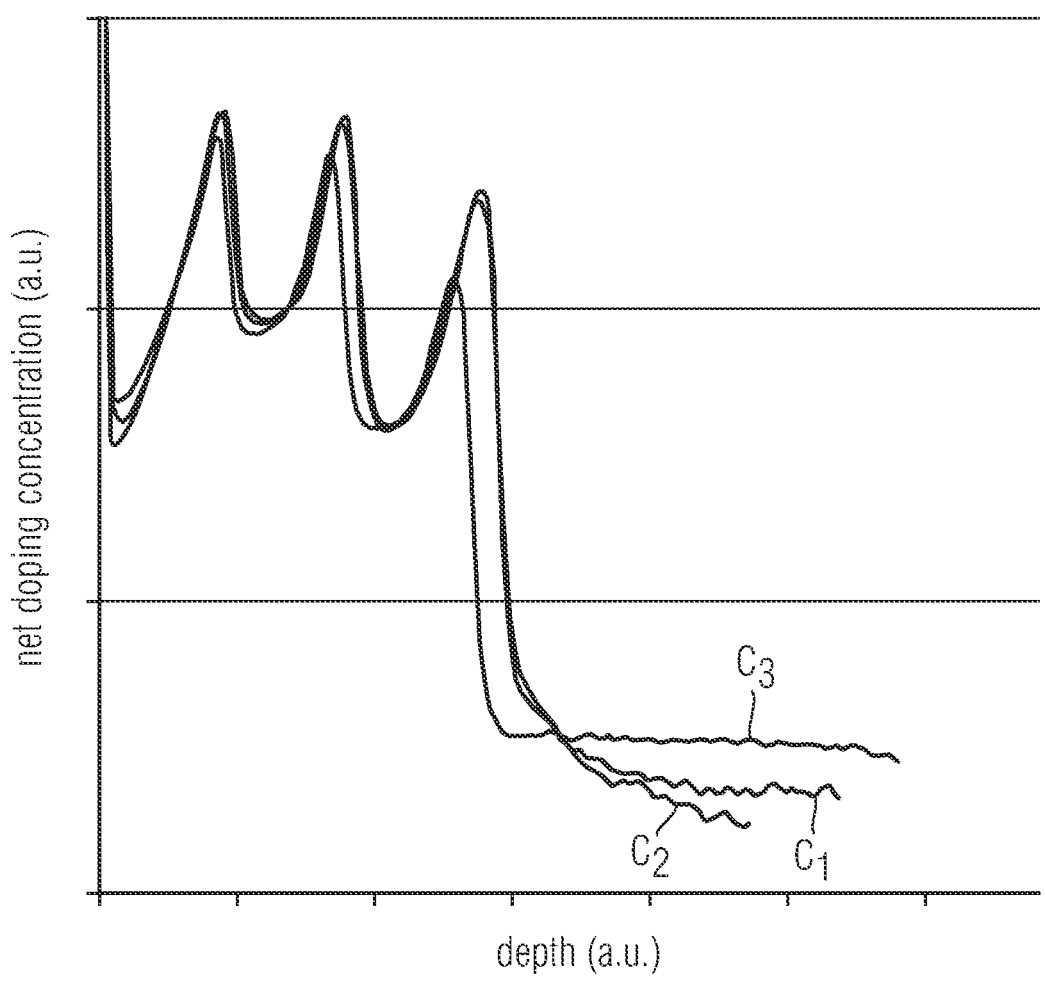
FIG. 6 is a graph illustrating net doping profiles of a field stop zone formed by same processing in Magnetic Czochralski silicon base material and in Float Zone silicon base material.

FIG. 6 is a graph illustrating net doping profiles of a field stop zone formed by the same processing in Magnetic Czochralski (MCZ) silicon base material (curves c1 and c2) and in Float Zone (FZ) silicon base material (curve c3). The profiles c1 . . . c3 have been determined by spreading resistance profiling (SRP) along a vertical direction into a depth of the semiconductor body 205 from the first side 209. The curves c1 and c2 related to MCZ base material include an oxygen concentration as described with respect to FIGS. 1A to 1C. Activation of hydrogen-vacancy shallow donor complexes in the field stop zones related to MCZ base material (curves c1, c2) is greater than in the field stop zone related to FZ base material (curve c3).

Figure 7:
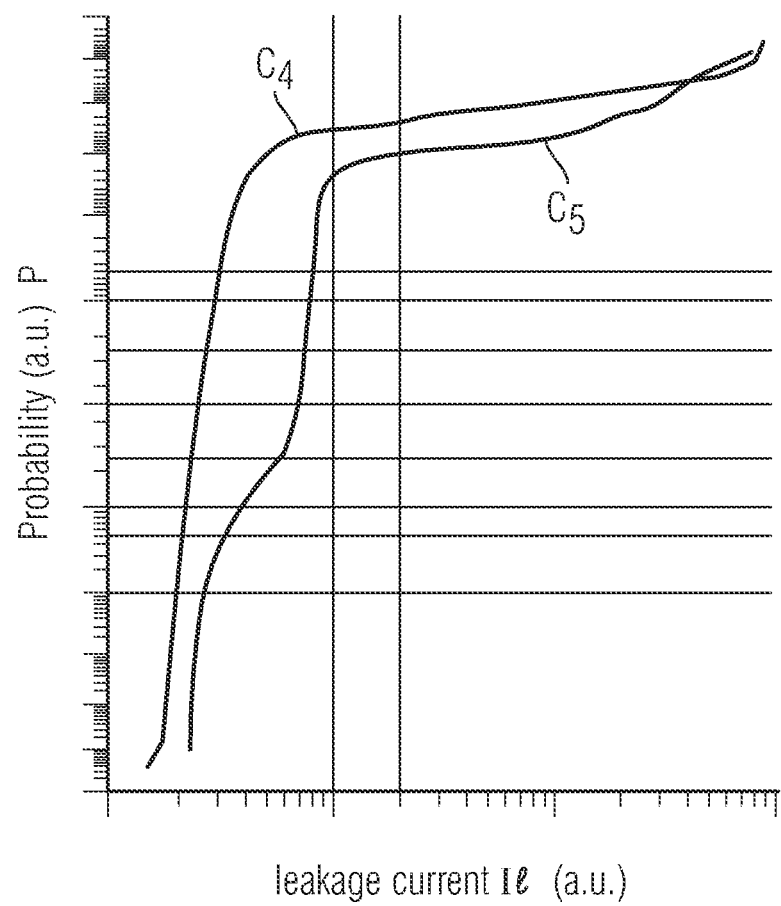
FIG. 7 is a graph illustrating a distribution of probabilities of leakage currents of power semiconductor diodes formed by same processing in Magnetic Czochralski silicon base material and in Float Zone silicon base material.

FIG. 7 is a graph illustrating a distribution of probability p of leakage currents I1 of power semiconductor diodes formed by same processing in Magnetic Czochralski silicon base material (curve c4) and in Float Zone silicon base material (curve c5). The curve c4 related to MCZ base material includes an oxygen concentration as described with respect to FIGS. 1A to 1C. In the power semiconductor diodes including field stop zones formed in MCZ base material (curve c4), smaller leakage currents are more likely to occur due to the effects described above than in the power semiconductor diodes including field stop zones formed in FZ base material (curve c5).

Figure 8:
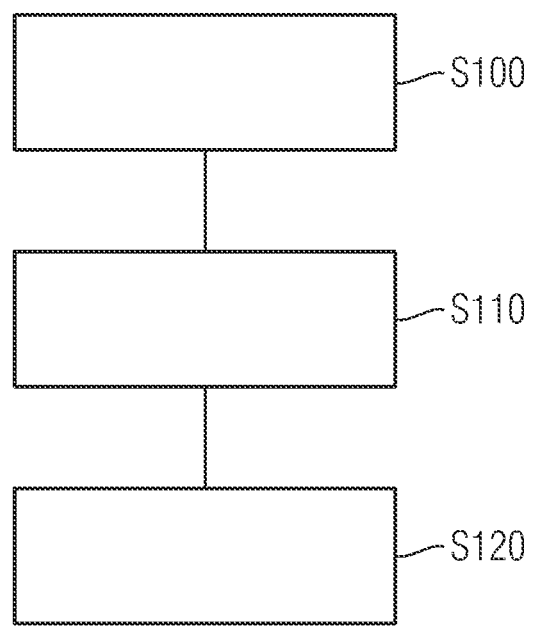
FIG. 8 is a schematic process chart illustrating an embodiment of manufacturing a semiconductor device.

FIG. 8 is a schematic process chart illustrating an embodiment of manufacturing a semiconductor device.

Process feature S100 comprises introducing platinum into a semiconductor body comprising an oxygen concentration in a range of $5\times10^{16}$ cm⁻³ and $5\times10^{17}$ cm⁻³. According to an embodiment, platinum is introduced by an ion implantation and/or diffusion process.

Process feature S110 comprises irradiating the semiconductor body with protons through a first surface.

Process feature S120 comprises annealing the semiconductor body in a temperature range of 300° C. to 550° C.

Apart from carrying out process features S100 to S120 in the order S100, S110, S110, the process features S100 to S120 may be carried out in the order S110, S100, S120, or in the order S100, S110, S100, S120, for example.

By generating vacancies in the semiconductor body combined with an increased concentration of oxygen as well as platinum in the semiconductor body, benefits such as leakage current reduction, suppression of increase of forward voltage drop due to undesired counter-doping by acceptor-like hydrogen/vacancy/platinum complexes may be achieved. The method illustrated in FIG. 8 may also be applied to manufacture the semiconductor devices described with respect to the embodiments above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a field stop zone comprising hydrogen-vacancy shallow donor complexes by:
        irradiating portion of a semiconductor body with a laser beam through a first surface of the semiconductor body, the portion comprising an oxygen concentration in a range of $5\times10^{16}$ cm⁻³ to $5\times10^{17}$ cm⁻³;
        irradiating the semiconductor body with protons through the first surface; and
        annealing the semiconductor body in a temperature range of 300° C. to 550° C., so as to form the hydrogen-vacancy shallow donor complexes,
    wherein absorption of the laser beam in the semiconductor body locally melts the semiconductor body at the first surface and generates vacancies in a part of the semiconductor body extending from the first surface to a depth, wherein the depth is 5 μm or greater.

2. The method of claim 1, wherein the annealing is carried for a duration between 30 minutes to four hours.

3. The method of claim 1, wherein the semiconductor body is a magnetic Czochralski silicon body.

4. The method of claim 1, further comprising, prior to irradiation with the laser beam, introducing dopants into an area at the first surface and electrically activating the dopants.

5. The method of claim 1, wherein irradiating the portion of the semiconductor body with the laser beam is carried out multiple times.

6. The method of claim 1, further comprising introducing platinum into the semiconductor body.

7. The method of claim 1, wherein irradiating the semiconductor body with protons is carried out multiple times at different implantation energies.

8. The method of claim 7, wherein the implantation energies range between 100 keV and 5 MeV.

9. The method of claim 1, wherein irradiating the semiconductor body with protons is carried out multiple times at different doses.

10. The method of claim 9, wherein the doses range between $0.5\times10^{13}$ protons/cm² and $5\times10^{14}$ protons/cm².

11. The method of claim 1, further comprising forming an anode at a second surface opposite to the first surface and forming a cathode at the first surface.

12. The method of claim 1, further comprising forming a gate and an emitter at a second surface opposite to the first surface and forming a collector at the first surface.

13. The method of claim 1, wherein the semiconductor device is a vertical semiconductor power device, the method further comprising:
    forming a first load terminal structure at the first surface of the semiconductor body having opposite first and second surfaces; and forming a second load terminal structure at the second surface of the semiconductor body.

14. The method of claim 1, wherein the depth is 30 μm or less.

15. The method of claim 1, wherein the depth is between 15 μm and 25 μm.

16. A method of manufacturing a semiconductor diode, the method comprising:
   forming an anode region in a semiconductor body having opposite first and second surfaces by introducing p-type dopants through the second surface into the semiconductor body;
   forming a cathode region in the semiconductor body by introducing n-type dopants through the first surface into the semiconductor body; and
   forming a field stop zone comprising hydrogen-vacancy shallow donor complexes by:
      irradiating a portion of the semiconductor body with a laser beam through the first surface of the semiconductor body, the portion comprising an oxygen concentration in a range of $5 \times 10^{16}$ cm$^{-3}$ and $5 \times 10^{17}$ cm$^{-3}$;
      irradiating the semiconductor body with protons through the first surface; and
      annealing the semiconductor body in a temperature range of 300° C. to 550° C., so as to form the hydrogen-vacancy shallow donor complexes,
   wherein absorption of the laser beam in the semiconductor body locally melts the semiconductor body at the first surface and generates vacancies in a part of the semiconductor body extending from the first surface to a depth, wherein the depth is 5 μm or greater.

17. The method of claim 16, wherein the n-type dopants comprise phosphorus.

18. The method of claim 16, wherein the n-type dopants are electrically activated by irradiating the portion of the semiconductor body with the laser beam.

19. The method of claim 16, further comprising introducing platinum into the semiconductor body.

20. The method of claim 16, wherein the depth is 30 μm or less.

21. The method of claim 16, wherein the depth is between 15 μm and 25 μm.

* * * * *

UNITED STATES PATENT AND TRADEMARK OFFICE
CERTIFICATE OF CORRECTION

PATENT NO. : 9,887,125 B2
APPLICATION NO. : 14/297764
DATED : February 6, 2018
INVENTOR(S) : H. Schulze et al.

Page 1 of 1

It is certified that error appears in the above-identified patent and that said Letters Patent is hereby corrected as shown below:

In the Claims

Column 8, Line 18 (Claim 1, Line 5) please change "irradiating portion" to -- irradiating a portion --

Signed and Sealed this
Twenty-ninth Day of May, 2018

Andrei Iancu
*Director of the United States Patent and Trademark Office*